(12) United States Patent
Lieu

(10) Patent No.: US 10,236,267 B2
(45) Date of Patent: Mar. 19, 2019

(54) METHODS OF FORMING FLIP CHIP SYSTEMS

(71) Applicant: Kyocera America Inc., San Diego, CA (US)

(72) Inventor: Dinah Lieu, San Diego, CA (US)

(73) Assignee: Kyocera International, Inc., San Diego, CA (US)

( * ) Notice: Subject to any disclaimer, the term of this patent is extended or adjusted under 35 U.S.C. 154(b) by 0 days.

(21) Appl. No.: 14/815,086

(22) Filed: Jul. 31, 2015

(65) Prior Publication Data

US 2016/0035686 A1   Feb. 4, 2016

Related U.S. Application Data

(60) Provisional application No. 62/032,161, filed on Aug. 1, 2014.

(51) Int. Cl.
*H01L 21/44* (2006.01)
*H01L 21/48* (2006.01)
*H01L 23/00* (2006.01)

(52) U.S. Cl.
CPC ............ *H01L 24/13* (2013.01); *H01L 24/11* (2013.01); *H01L 24/16* (2013.01); *H01L 24/81* (2013.01); *H01L 24/29* (2013.01); *H01L 24/32* (2013.01); *H01L 2224/11003* (2013.01); *H01L 2224/1134* (2013.01); *H01L 2224/1182* (2013.01); *H01L 2224/11901* (2013.01); *H01L 2224/136* (2013.01); *H01L 2224/1308* (2013.01); *H01L 2224/1356* (2013.01); *H01L 2224/1357* (2013.01); *H01L 2224/13083* (2013.01); *H01L 2224/13124* (2013.01); *H01L 2224/13144* (2013.01); *H01L 2224/13147* (2013.01);
(Continued)

(58) Field of Classification Search
CPC ......... H01L 24/13; H01L 24/16; H01L 24/11; H01L 24/81; H01L 2224/81444; H01L 2224/136; H01L 2224/13124; H01L 2224/16245; H01L 2224/13147; H01L 2224/11003; H01L 2224/32245; H01L 2224/13144; H01L 2224/81201; H01L 2224/16227; H01L 2224/814; H01L 2224/32225; H01L 2224/16238; H01L 2224/2919; H01L 2224/13083; H01L 2224/73204; H01L 2224/8149; H01L 24/29; H01L 2224/16258; H01L 2224/1356; H01L 2224/11901; H01L 2224/1134; H01L 2224/1182; H01L 2224/13611; H01L 24/32; H01L 2224/1308; H01L 2224/81191; H01L 2224/81815; H01L 2224/1357; H01L 2924/351; H01L 2224/13562
USPC .................................. 438/108, 612, 613, 666
See application file for complete search history.

(56) References Cited

U.S. PATENT DOCUMENTS

2002/0047216 A1*  4/2002  Jiang ..................... H01L 24/16
                                                        257/778
2002/0192443 A1   12/2002  Sarkhel
(Continued)

*Primary Examiner* — Kimberly N Rizkallah
*Assistant Examiner* — Dilinh P Nguyen

(57) ABSTRACT

Forming the chip attachment system includes obtaining a chip having a bump core on a die. The method also includes obtaining an intermediate structure having a transfer pad on a substrate. The method further includes transferring the transfer pad from the substrate to the bump core such that the transfer pad becomes a solder layer on the bump core.

18 Claims, 6 Drawing Sheets

(52) U.S. Cl.
CPC ............... *H01L 2224/13562* (2013.01); *H01L 2224/13611* (2013.01); *H01L 2224/16227* (2013.01); *H01L 2224/16238* (2013.01); *H01L 2224/16245* (2013.01); *H01L 2224/16258* (2013.01); *H01L 2224/2919* (2013.01); *H01L 2224/32225* (2013.01); *H01L 2224/32245* (2013.01); *H01L 2224/73204* (2013.01); *H01L 2224/814* (2013.01); *H01L 2224/8149* (2013.01); *H01L 2224/81191* (2013.01); *H01L 2224/81201* (2013.01); *H01L 2224/81444* (2013.01); *H01L 2224/81815* (2013.01); *H01L 2924/351* (2013.01)

(56) References Cited

U.S. PATENT DOCUMENTS

| | | | |
|---|---|---|---|
| 2010/0000773 A1* | 1/2010 | Yoshinaga | H01L 21/563 |
| | | | 174/260 |
| 2010/0171209 A1 | 7/2010 | Tanie et al. | |
| 2012/0319274 A1* | 12/2012 | Tanaka | H01L 23/49816 |
| | | | 257/738 |
| 2013/0043585 A1* | 2/2013 | Wakiyama | H01L 23/49816 |
| | | | 257/737 |
| 2013/0092721 A1* | 4/2013 | Trelford | H05K 3/4069 |
| | | | 228/256 |
| 2013/0133936 A1 | 5/2013 | Yorita et al. | |
| 2014/0083740 A1 | 3/2014 | Ishizawa et al. | |
| 2014/0159236 A1 | 6/2014 | Kim et al. | |
| 2015/0028432 A1* | 1/2015 | Kim | B81B 3/001 |
| | | | 257/415 |

\* cited by examiner

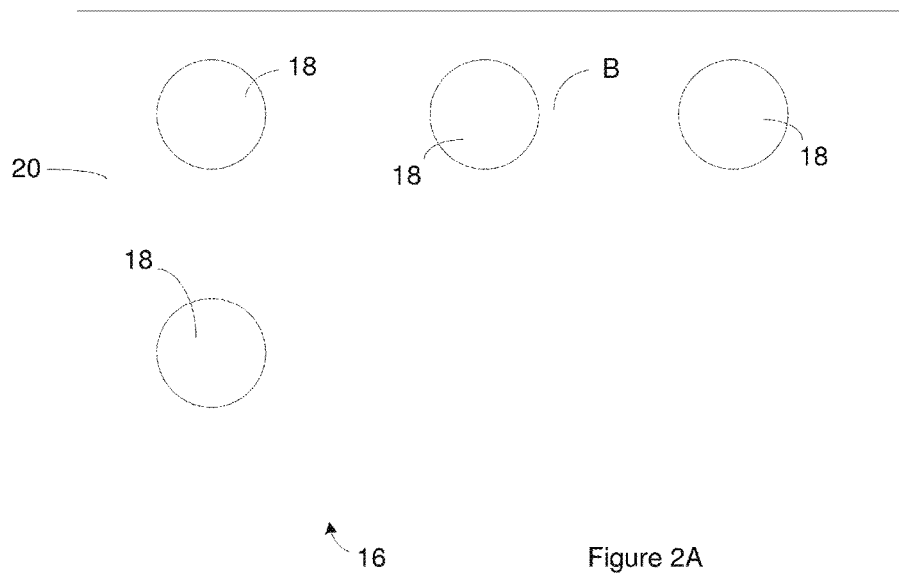
Figure 2A
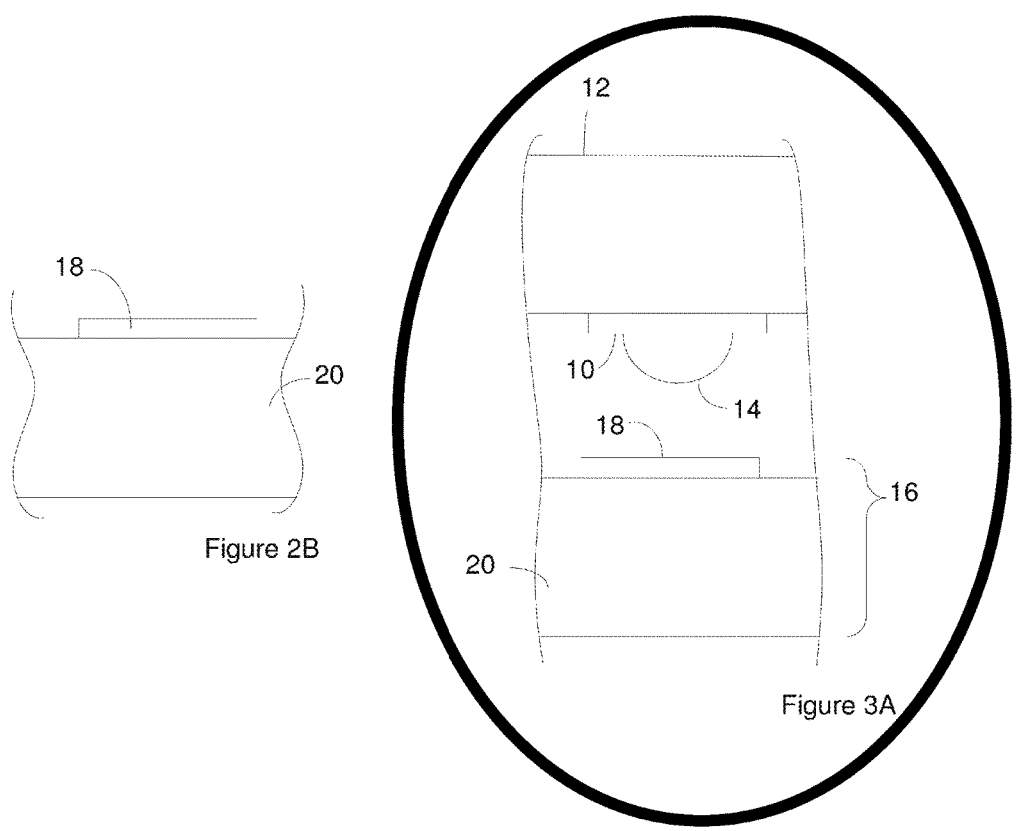
Figure 2B
Figure 3A

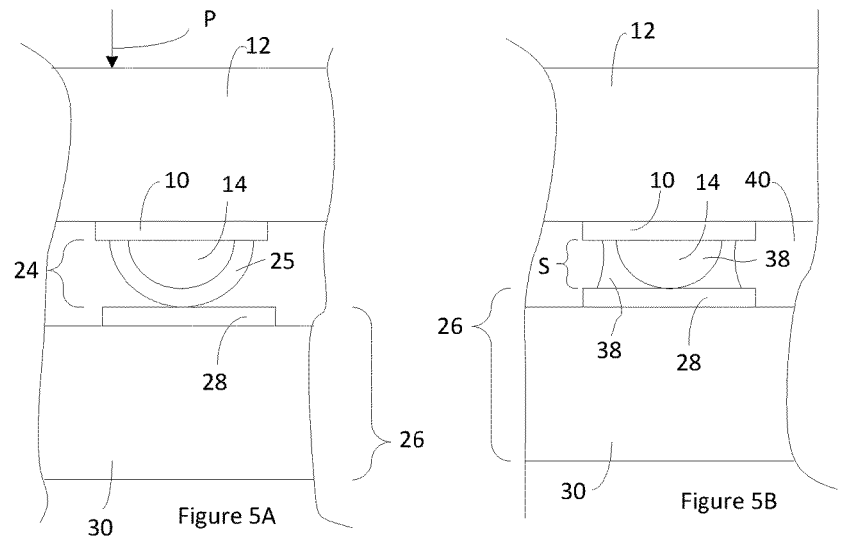
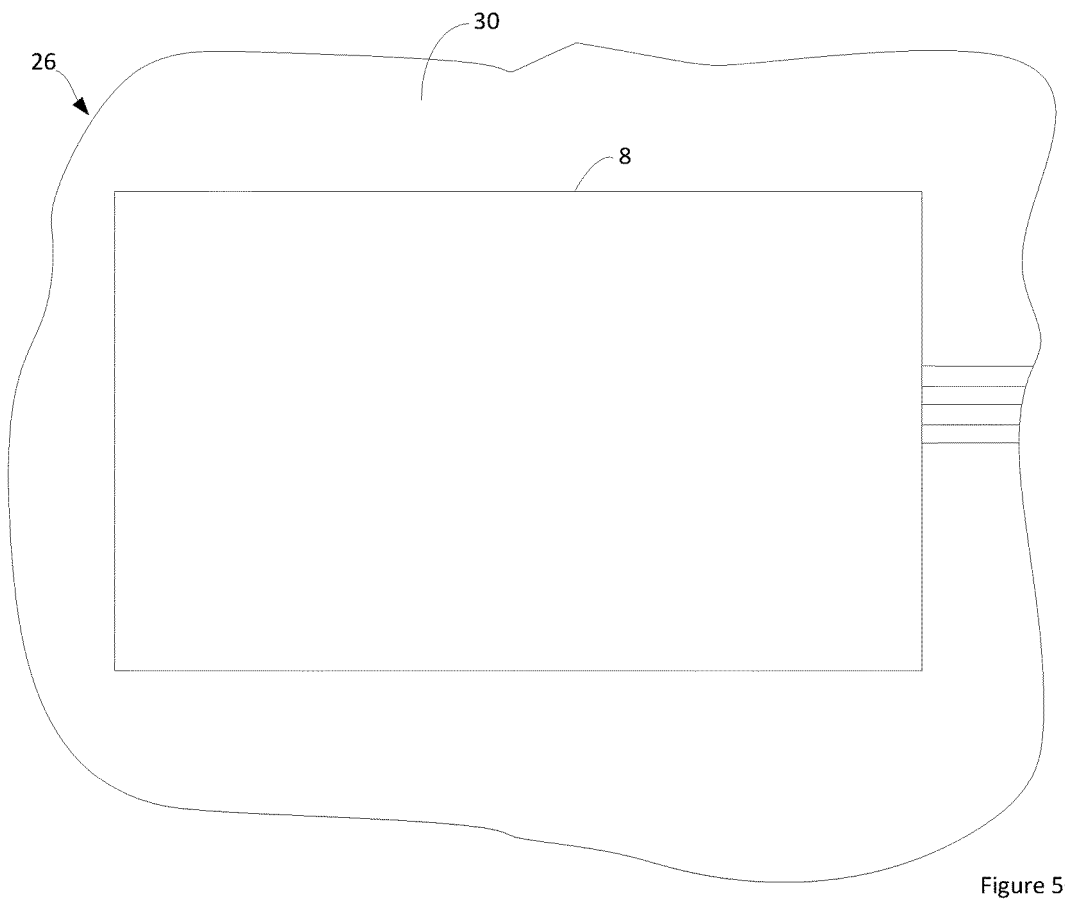

METHODS OF FORMING FLIP CHIP SYSTEMS

RELATED APPLICATIONS

This application claims the benefit of U.S. Provisional Patent Application Ser. No. 62/032,161, filed on Aug. 1, 2014, and incorporated herein in its entirety.

FIELD

This invention generally relates to attachment of electronic components and more particularly to solder bumps.

BACKGROUND

Flip chip mounting refers to a method of mounting a semiconductor chip on an external device. The semiconductor chip is flipped so the active side of the chip faces the external device and the flipped chip is bonded to the external device. One method of making this attachment positions gold bumps on contact pads located on the active side of the flip chip. Thermocompression is used to bond the gold bumps to contact pads on the external device. The gold bumps can then act as an electrical pathway between the flip chip and the external device. For instance, the gold bumps can provide electrical communication between the contact pads on the external device and the contact pads on the flip chip. Temperature cycling of the resulting device can cause the bond between the gold bumps and the pads to break. As a result, there is need for an improved method for attaching electrical components to one another.

SUMMARY

A flip chip includes a contact pad on a die. A chip bump is on the contact pad. The chip bump includes a solder layer on a bump core. In some instances, the bump core is between the solder layer and the contact pad.

The flip chip can be formed using a chip precursor that has a bump core on a die. An intermediate structure is also used. The intermediate structure has a transfer pad on a substrate. The transfer pad is transferred from the substrate to the bump core such that the transfer pad becomes the solder layer on the bump core.

BRIEF DESCRIPTION OF THE DRAWINGS

FIG. 2B illustrates an intermediate structure for use in forming a chip bump on the flip chip. FIG. 2A is a top view of the intermediate structure. The intermediate structure includes solder on a substrate.

FIG. 2B is a cross section of the intermediate structure shown in FIG. 2A taken along the line labeled B in FIG. 2A.

FIG. 3A illustrates a solder transfer system that includes the portion of the flip chip of FIG. 1C aligned with the portion of the intermediate structure shown in FIG. 2B.

FIG. 5A illustrates an attachment system that includes the portion of the flip chip of FIG. 3D aligned with the portion of the electronic device illustrated in FIG. 4D.

FIG. 5B illustrates the attachment system of FIG. 5A after reflow of the solder layer.

FIG. 5C is a top view of the electronic device with the flip chip attached to the electronic device.

DETAILED DESCRIPTION

A flip chip includes one or more chip bumps. Before attachment of the flip to an external device, the chip bumps include a solder layer on a bump core. The flip chip can be attached to the external device such that the solder layer is bonded with contact pads on both the flip chip and the external device. The attachment provided by the solder layer is more tolerant of stress than the attachment provided by the thermocompression used in the prior art.

In some instances, the attachment of the flip chip and the external device is performed without substantially changing the shape of the bump core but with the bump core spanning the resulting gap between the flip chip and the external device. As a result, the height of the bump core determines the distance of separation between the flip chip and the external device. The height of the bump cores on the flip chip can be selected so as achieve a particular separation between the flip chip and the external device. Accordingly, the chip bumps provide a more reliable bond between the flip chip and the external device while also providing control of the resulting separation between the flip chip and the external device.

The chip bumps can be formed using a flip chip precursor that includes one or more bump cores in the locations where the chip bumps will be formed. An intermediate structure is also used in the formation of the chip bumps. The intermediate structure includes one or more solder layers patterned on the flat surface of a substrate. The solder layers are transferred from the substrate onto the bump cores such that the solder layers serve as the solder layers of the chip bumps. The intermediate structure allows the solder layers to be formed on a flat surface rather than directly on the bump cores. The formation of the solder layers on the flat surface has provided a much more uniform solder layer thickness than can be achieved when forming the solder layers directly on the bump cores. The increased thickness uniformity increases the reliability of the resulting chip bumps. Additionally, the solder layers can be transferred to the die of a single flip chip. In contrast, prior method of forming solder bumps generally form the solder bumps on all of the dies included in a wafer. The ability to form the chip bumps on a smaller sample of dies reduces the costs and complexities associated with screening different solder materials for use with a particular combination of flip chip and external device.

Figure 1:
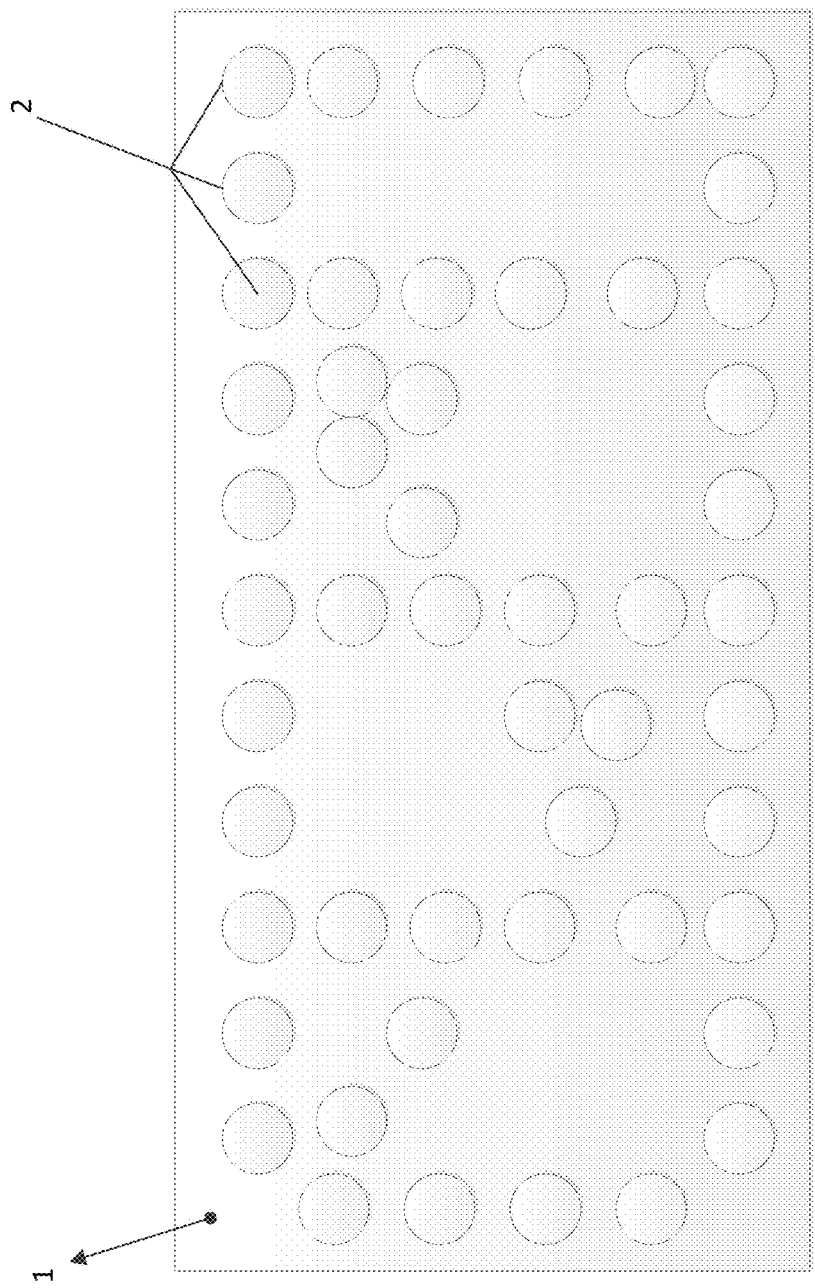
FIG. 1A is top view of a flip chip.
FIG. 1B is cross section of the flip chip shown in FIG. 1A taken along the line labeled B in FIG. 1A. The chip includes multiple contact pads on a die.
FIG. 1C is a cross section of a bump core formed on the contact pad of FIG. 1B such that the contact pad is between the bump core and the die.
FIG. 1D is a cross section of a multi-layer bump core formed on the contact pad of FIG. 1B FIG. 2A

FIG. 1A is top view of a flip chip. FIG. 1B is cross section of the flip chip shown in FIG. 1A taken along the line labeled B in FIG. 1A. The chip includes multiple contact pads 10 on a die 12. Suitable materials for the contact pads 10 include, but are not limited to, aluminum. Suitable dies 12 include or consist of one or more materials selected from a group consisting of silicon, gallium nitride, and gallium arsenide. Although not illustrated, the contact pads 10 can be in electrical communication with one or more electrical circuits on the die and/or electrical components on the die 12. For instances, examples of suitable flip chips include, but are not limited to, integrated circuit chips, microelectromechanical systems (MEMs), photonic integrated circuits (PIC), and transimpedance amplifiers (TIA).

FIG. 1C illustrates a bump core 14 formed on the contact pad 10 of FIG. 1B such that the contact pad 10 is between the bump core 14 and the die 12. Although FIG. 1C illustrates the bump core 14 as constructed from a single layer of material, however, the bump core can be constructed of multiple layers of materials stacked as illustrated in FIG. 1D. Multiple layers of material can be stacked on a contact pad 10 to provide the bump core 14 with the desired height. For instance, the bump core can be formed by stacking gold studs until the bump core 14 has the desired height. A suitable height for the bump core 14 includes a height of greater than 0.1 mils (thousandths of an inch) or 0.7 mils above the contact pad 10 and/or less than 10.0 mils or 50 mils above the contact pad 10. The bump core also has a width or diameter labeled D in FIG. 1C. A suitable width or diameter for the bump core 14 includes a width or diameter greater than 0.1 mils or 0.7 mils, and/or less than 3.0 mils or 20 mils.

When a bump core 14 includes or consists of multiple layers of material, the different layers can be the same or different materials. One or more layers of material in the bump cores 14 can be formed on the contact pad 10 using Cu pillars, or Au pillars or with techniques such as wirebond gold ball bumping. In some instances, the bump core 14 includes or consists of an electrically conducting material such as a metal. The bump core 14 can have a melting point between the melting point of the die 12 and the melting point of a solder layer that is discussed in more detail below. Suitable bump cores 14 can have a melting point greater than 375° C. and/or less than 1,250° C. Suitable materials for the bump core 14 and/or for layers of material in the bump core 14 include, but are not limited to, metals and/or metal alloys that include or consist of gold, aluminum and copper.

FIG. 2A and FIG. 2B illustrates an intermediate structure 16 for use in forming a chip bump 24 on the flip chip. FIG. 2A is a top view of the intermediate structure 16. FIG. 2B is a cross section of the intermediate structure 16 shown in FIG. 2A taken along the line labeled B in FIG. 2A. The intermediate structure 16 includes one or more transfer pads 18 on a substrate 20. The transfer pads 18 can include or consist of a solder paste. Solder paste generally includes or consist of solder suspended in flux. Suitable solders for the transfer pads 18 are metal alloys with a melting point less than the melting point of the die 12 and/or of the bump core 14. In some instances, the transfer pad 18 has a melting point less than 340° C. or 317° C. and/or greater than 160° C. or 183° C. Example materials for the solder, include, but are not limited to, solders that include or consist of tin and lead, solders that include or consist of tin and gold, and solders that include or consist of tin, silver and copper such as SAC solders including SAC 105, SAC387, solders that include or consist of indium and lead. The substrate 20 can include or consist of one or more layers of material. At least the portion of the substrate 20 that contacts the solder includes or consists of one or more materials selected from the group consisting of glass and ceramic.

The position of the transfer pads 18 on the substrate 20 mirrors the positions of at least a portion of the bump cores 14 on the flip chip. For instance, the transfer pads 18 are arranged such that the flip chip can be positioned over the intermediate structure 16 with the transfer pads 18 aligned with the bump cores 14. As an example, the transfer pads 18 can be arranged such that the flip chip can be positioned over the intermediate structure 16 with the center of each bump core over the center of one of the transfer pads 18. FIG. 3A illustrates a solder transfer system that includes the portion of the flip chip of FIG. 1C aligned with the portion of the intermediate structure 16 shown in FIG. 2B. The flip chip is inverted over the intermediate structure 16 with the bump core positioned over the solder contact pad 10. For instance, a line can be drawn that is perpendicular to a surface of the die 12 and that extends through both the bump core 14 and the aligned transfer pad 18. In some instances, the line can extend through both the center of the bump core 14 and the center of the aligned transfer pad 18.

A suitable method of forming the transfer pads 18 on the substrate 20 includes, but is not limited to, solder printing, and solder dispensing. Solder printing can be an automated, semi-automated, or manual printing process. A stencil with the desired pattern is positioned on the substrate, which my be a slide made out of glass or ceramic, and the solder paste is positioned on the stencil. A blade is wiped across the stencil so as to fill openings through the stencil with the solder paste. The stencil is lifted off the substrate leaving the solder paste on the substrate in the desired pattern. The solder pattern cleanly comes off of the slide during reflow, and so the slide can be reused.

Figure 3B:
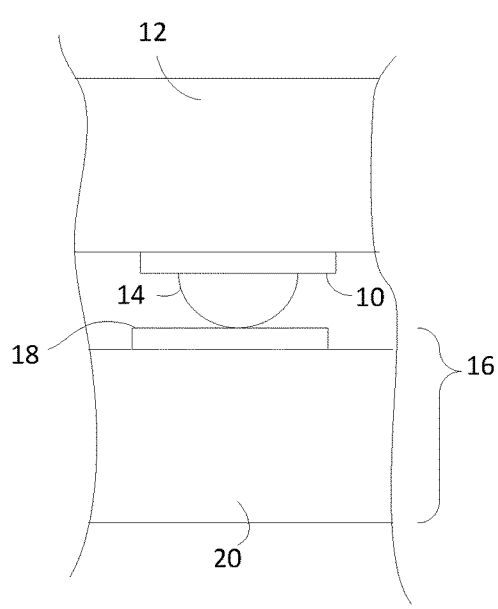
FIG. 3B illustrates the solder transfer system of FIG. 3A with the intermediate structure contacting the flip chip.

The one or more transfer pads 18 on the intermediate structure 16 can be placed in proximity of the one or more bump cores 14 on the flip chip or brought into contact with the one or more bump cores 14 on the flip chip. For instance, FIG. 3B illustrates the solder transfer system of FIG. 3A with the intermediate structure 16 contacting the flip chip. In particular, the bump core 14 contacts the aligned transfer pad 18. Pressure can optionally be applied in the direction of the arrow labeled P in FIG. 3B.

The one or more transfer pads 18 on the intermediate structure 16 can be transferred from the intermediate structure 16 to the flip chip. In particular, the one or more transfer pads 18 on the intermediate structure 16 can each be transferred from the intermediate structure 16 to a bump core 14 on the flip chip such that each transfer pad 18 forms a solder layer 25 on the bump cores 14. For instance, the temperature of the transfer pads 18 and/or the intermediate structure 16 in the solder transfer system of FIG. 3B can be elevated such that the solder reflows onto the bump core 14 as shown in the solder transfer system of FIG. 3C. The solder layer 25 can be in direct contact with the bump core 14.

The substrate 20 can be removed from contact and/or proximity with the flip chip to provide one or more chip bumps 24 on the flip chip. For instance, FIG. 3D illustrates the chip bump 24 that results from removing the substrate 20 from the portion of the flip chip shown in FIG. 3C. The resulting chip bump 24 has multiple layers of different material. For instance, the chip bump 24 includes or consists of the solder layer 25 on the bump core 14. The solder layer 25 can extend from the top of the bump core 14 down to the die 12. Additionally or alternately, the solder layer 25 can surround the bump core 14. For instance, FIG. 3E could be a top view of the chip bump 24 shown in FIG. 3D after a cross section is taken along a plane that is parallel to the upper surface of the flip chip and that includes the line labeled E in FIG. 3D. The resulting top view shows the solder layer 25 surrounding the bump core 14. Additionally, the solder layer 25 can be positioned over the bump core 14 such that there are no pores, channels or other recesses extending through the solder layer 25. For instance, the solder layer 25 can be positioned over the bump core 14 such that none of the bump core 14 is exposed to the atmosphere in which the flip chip is positioned.

Figure 3C:
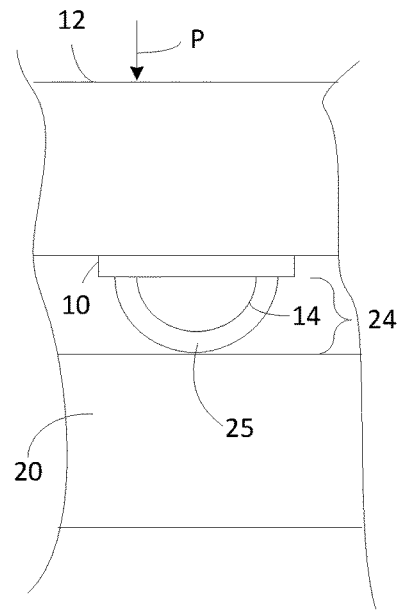
FIG. 3C illustrates the solder transfer system of FIG. 3B with solder transferred from the intermediate structure to the bump core of the flip chip.
Figure 3D:
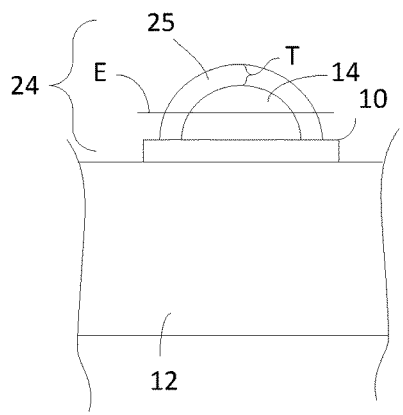
FIG. 3D illustrates the chip bump that results from removing the substrate from the portion of the flip chip shown in FIG. 3C.

A thickness of the solder layer 25 on the solder bump is labeled T in FIG. 3C. A suitable thickness for the solder layer 25 includes, but is not limited to, a thickness greater than 0.01 mils or 0.5 mils and/or less than 3.0 mils or 10 mils. The method of forming a solder layer 25 on the bump core 14 illustrated in FIG. 1A through FIG. 3E is suitable for forming chip bumps 24 having solder layers 25 with a thickness in this range. The method illustrated in FIG. 3A through FIG. 3E can be sequentially repeated. As a result, a thicker solder layer 25 can be formed on a bump core 14 by sequentially transferring transfer pads 18 from multiple intermediate structures 16 to a bump core 14. Additionally or alternately, transfer pads 18 sequentially transferred to a bump core 14 can be different materials. As a result, the solder layer 25 can include different layers of different materials. The use of the intermediate structure 16 to form the solder layers 25 on the bump cores 14 has proven to provide a surprisingly consistent thickness of solder layer 25 on the bump core 14.

Figure 4:
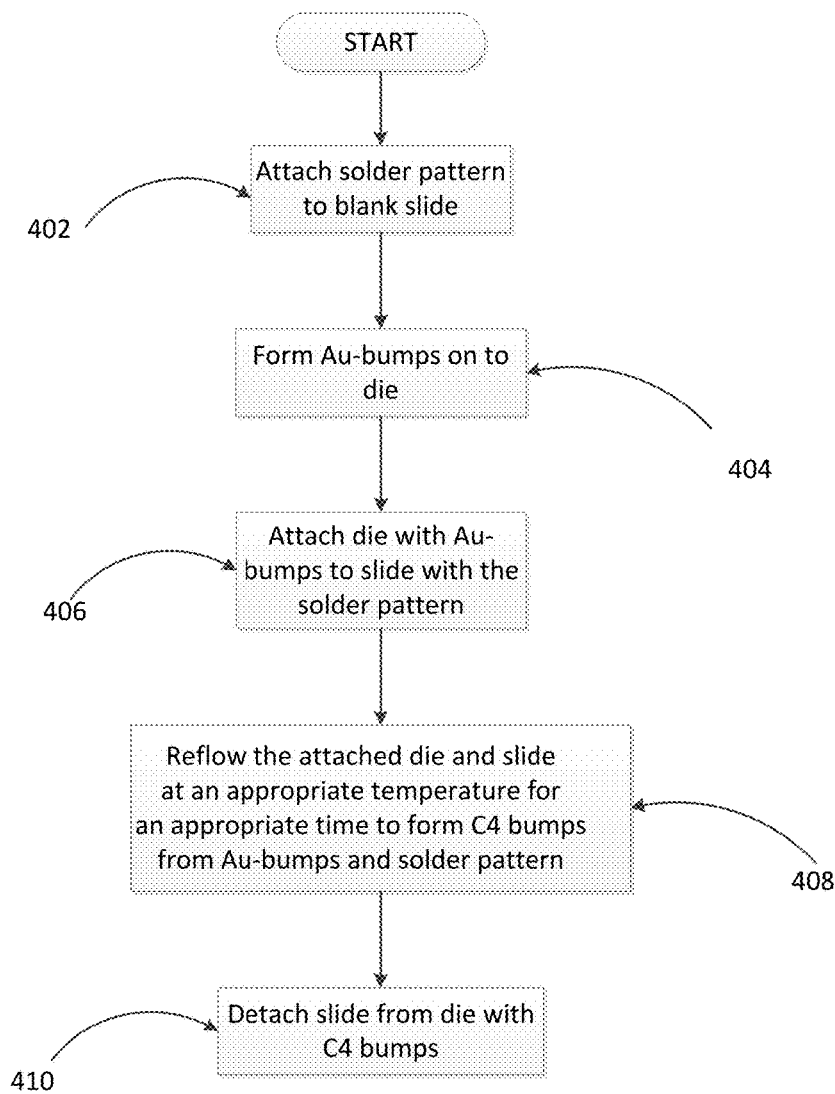
FIG. 4A is a top view of an example electronic device such as a package carrier or a printed circuit board.
FIG. 4B is a cross section of the electronic device shown in FIG. 4A taken along the line labeled B in FIG. 4A.

In some instances, the chip bumps 24 are used as Controlled Collapse Chip Connection bumps (C4 bumps). For instance, the chip bumps 24 can be used to connect the flip chip to an electronic device. FIG. 4A is a top view of an example electronic device 26 such as a package carrier, a printed circuit board, or a lead frame. FIG. 4B is a cross section of the electronic device 26 shown in FIG. 4A taken along the line labeled B in FIG. 4A. The electronic device 26 includes device contact pads 28 on a support 30. The electronic device 26 optionally includes conductors 32 on the support 30. In some instances, the conductors 32 can provide electrical communication between the device contact pads 28 and other electrical circuitry (not shown) and/or electrical components on the support 30.

The position of at least a portion of the device contact pads 28 on the support 30 mirrors the positions of at least a portion of the chip bumps 24 on the flip chip. For instance, the device contact pads 28 are arranged such that the flip chip can be inverted and positioned over the device with the device contact pads 28 aligned with the chip bumps 24. As an example, the device contact pads 28 can be arranged such that the flip chip can be positioned over the device with the centers of at least a portion of the chip bumps 24 each being located over a center of one of the device contact pads 28. As an example, FIG. 5A illustrates an attachment system that includes the portion of the flip chip of FIG. 3D aligned with the portion of the electronic device 26 illustrated in FIG. 4D. The flip chip is inverted over the electronic device 26 with the chip bump 24 positioned over a device contact pad 28. For instance, a line can be drawn that is perpendicular to a surface of the electronic device 26 and that extends through both the chip bump 24 and the aligned device contact pad 28. In some instances, the line can extend through both the center of the chip bump 24 and the center of the aligned device contact pad 28.

The one or more device contact pads 28 on the electronic device 26 are placed in contact with the one or more chip bumps 24 on the flip chip. For instance, FIG. 5A illustrates the electronic device 26 in contact with the flip chip. In particular, the chip bump 24 contacts the aligned device contact pad 28. Pressure can optionally be applied to the flip chip and/or electronic device so as to compress together the flip chip and electronic device. For instance, pressure can be applied to the flip chip in the direction of the arrow labeled P in FIG. 5A while the electronic device is held stationary.

The solder in the one or more chip bumps 24 can be used to attach the flip chip to the electronic device 26. For instance, the temperature of the chip bumps 24 and/or the flip chip in the attachment transfer system of FIG. 5A can be elevated such that the solder layer 25 reflows and is then cooled such that the solder from the solder layer 25 forms a solder member 38 that attaches the flip chip and the electronic devices 26 as shown in FIG. 5B and FIG. 5C. FIG. 5B illustrates the attachment system of FIG. 5A after reflow of the solder layer 25. FIG. 5C is a top view of the electronic device 26 with the flip chip 8 attached to the electronic device 26. The solder layer 25 can be selected such that the solder layer 25 has a lower melting point than the bump core 14. As a result, the temperature to which the solder is exposed during reflow can optionally be between the melting point of the solder layer 25 and the melting point of the bump core 14. This arrangement of material melting points allows full or partial reflow of the solder layer 25 without melting the bump core 14. This reflow does not occur during the prior thermocompression processes.

Figure 3E:
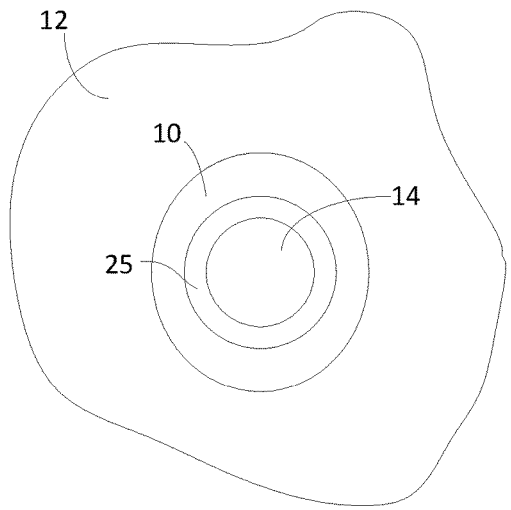
FIG. 3E is a top view of the chip bump shown in FIG. 3D after a cross section was taken along a plane that is parallel to the upper surface of the flip chip and that includes the line labeled E in FIG. 3D

The chip bump 24 can provide an electrical and/or mechanical connection between the flip chip and the electronic device 26. As is evident from FIG. 5B, the solder member 38 can contact both the flip chip and the electronic device 26. Although not shown in FIG. 5A or FIG. 5B, the solder member 38 can continue to surround the bump core 14 as illustrated in FIG. 3E. The material for the solder can be selected such that the solder member 38 is electrically conductive. Additionally or alternately, the bump core 14 can be constructed such that the bump core 14 is electrically conducting. As a result, the bump core 14 and/or the solder member 38 can provide electrical communication between a device contact pad 28 and a contact pad 10 on the flip chip.

In FIG. 5A, the solder layer 25 of the chip bump 24 contacts the device contact pad 28 and also contacts the contact pad 10 on the flip chip. However, the solder layer 25 is between the bump core 14 and the device contact pad 28 such that the bump core 14 does not contact the device contact pad 28. In contrast, in FIG. 5B, the bump core 14 contacts the device contact pad 28. Compression of the attachment system as discussed above can cause movement of the flip chip and the electronic device 26 toward one another in response to the reflow of the solder layer 25. Alternately, before reflow of the solder layer 25, the compression can be sufficient for the top of the bump core 14 to penetrate the solder layer 25 such that the bump core 14 comes into contact with the device contact pad 28. Additionally or alternately, the level of compression can be sufficient for the bump core 14 to become deformed as a result of the compression. The level of compression that deforms the bump core 14 can be applied before, during and/or after reflow of the solder layer 25. As a result, the deformation of the bump core 14 can be entirely a result of the compression or can be a combination of the compression and the elevated temperature. For instance, the temperature used to provide reflow of the solder layer 25 can be sufficient to provide full or partial melting of the bump core 14. Deformation of the bump core 14 combined with contact between the device contact pad 28 and the bump core 14 allows the bump core 14 to become bonded to both the device contact pad 28 and the contact pad 10 of the flip chip. Accordingly, the bump core 14 can also take part in bonding the flip chip and the electronic device 26.

As is evident in FIG. 5B, in some instances, the bump core 14 contacts the contact pad 10 and the device contact pad 28 and accordingly spans the distance between the flip chip and the electronic device 26. As a result, the height of the bump core 14 can determine the separation between the flip chip and the electronic device 26. Accordingly, the one or more bump cores 14 on a flip chip can be formed with a height that is desired for the separation between the flip chip and the electronic device 26 (labeled S in FIG. 5B). When the bump core 14 becomes deformed during the attachment of the flip chip and the electronic device 26, the separation between the flip chip and the electronic device 26 is less than the height of the bump core 14 before attachment. Increasing the degree of deformation of the bump core 14 can decrease the level of separation between the flip chip and the electronic device 26. In some instances where deformation of the bump core 14 occurs, the separation between the flip chip and the electronic device 26 is greater than 30% or 50% and/or less than or equal to 100% of the height of the bump core 14 before attachment of the flip chip and the electronic device 26. The chip bumps 24 can be constructed to provide separation between the flip chip and the electronic device 26 that is greater than 0.1 mil, or 1.0 mil and/or less than 5.0 mil or 50 mil.

A solid underfill 40 can optionally be located in the space between the flip chip and the electronic device 26. Suitable underfills 40 include electrically insulating adhesives. Examples of suitable underfills 40 include, but are not limited to, U8410-133 and/or U8439-105 available from Namics Corporation located in Niigata City, Japan.

The electronic device 26 can be a Printed Circuit Board (PCB). Accordingly, the support 30 can be a single layer or multi-layer substrate of a Printed Circuit Board (PCB). Additionally, the device contact pads 28 and the electrical conductors 32 can be the pads and conductive tracks or traces on a Printed Circuit Board (PCB). Alternately, the electronic device 26 can be a package carrier or a chip carrier. For instance, the electronic device 26 can be a lead frame package carrier or substrate package carrier. In some instances, the electronic device 26 is a lead frame. In these instances, the device contact pads 28 can be the leads of a lead frame and the support 30 need not be included in the electronic device 26. Suitable materials for the device contact pads 28 include, but are not limited to, plated Au, solder on pad (SOP), and organic solder preserve (OSP).

Figure 6A:
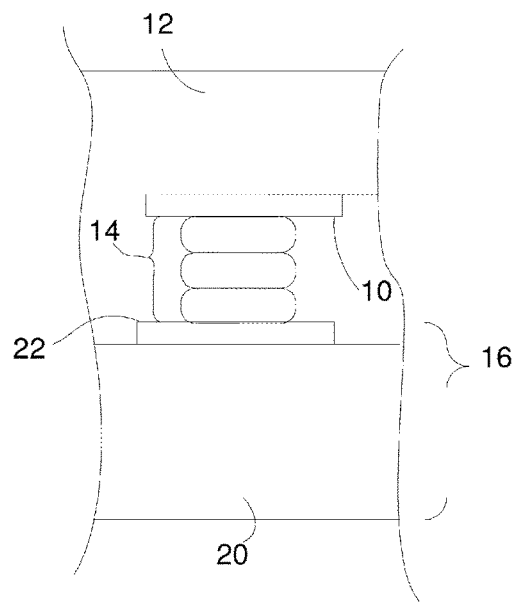
FIG. 6A is a cross section of the solder transfer system of FIG. 3B using a multilayer bump core such the multilayer bump core of FIG. 1D.
Figure 6B:
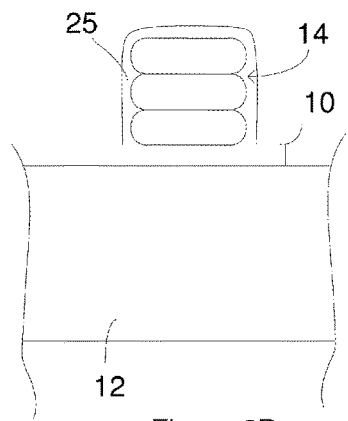
FIG. 6B is a cross section of a chip bump formed from the solder transfer system of FIG. 6A.
Figure 6C:
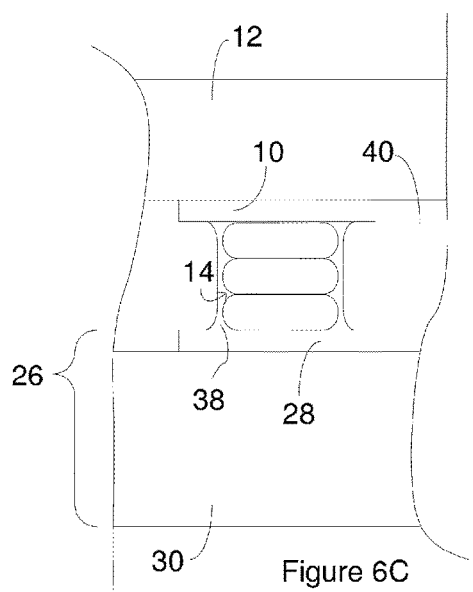
FIG. 6C is a cross section of an attachment system that includes an electronic device attached to a flip chip by a chip bump such as the chip bump of FIG. 6B.

Although the solder transfer system and the attachment system are illustrated with the bump core having a single layer of material, the solder transfer system and the attachment system can employ a multilayer bump core. For instance, FIG. 6A illustrates the solder transfer system of FIG. 3B using the multilayer bump core of FIG. 1D. FIG. 6B Illustrates the chip bump formed from the solder transfer system of FIG. 6A. FIG. 6C illustrates an attachment system that includes an electronic device attached to a flip chip by a chip bump such as the chip bump of FIG. 6B.

Although the attachment of the flip chip to the electronic device 26 is generally disclosed in the context of a single chip bump 24, multiple chip bumps 24 are often used in attachment of a flip chip and an electronic device 26. For instance, a chip bump 24 can be formed on each of the contact pads 10 illustrated in FIG. 1A and each of these chip bumps 24 can be used to bond the flip chip illustrated in FIG. 5C to the electronic device 26 illustrated in FIG. 5C.

Flip chip dies 12 are generally processed in wafers that often include more than 10 or even more than 1000 dies 12 on a single chip. The dies 12 are then separated from one another through processes such as dicing. The bump cores 14 can be formed on the dies 12 while the dies 12 are still included in the wafer or can be formed on one or more of the dies 12 after the one or more dies 12 has been separated from other dies 12 included in the wafer. Additionally or alternately, the solder layers 25 can be transferred from the intermediate structure 16 to one or more of the dies 12 after the one or more dies 12 has been separated from other dies 12 included in the wafer. As a result, chip bumps 24 can be formed on different dies 12 with the chip bumps 24 on different dies 12 having different materials in the solder layers 25. The different flip chips can then be attached to different electronic devices 26 as disclosed above. The resulting devices and/or chip bumps can then be tested for features such as bond strength, durability. The resulting devices and/or chip bumps can also be tested for bonding features such as the solubility of the solder member or solder layer in the bump core and/or for the solubility of bump core in the solder member or solder layer. Increasing the concentration of the bump core in the solder layer or solder member can affect the quality of the result. For instance, when gold dissolves in the tin of a solder layer, the resulting solder member can be undesirably brittle. Prior methods of forming solder bumps on a flip chip generally form the solder bumps on all of the dies 12 included in a wafer. The ability to form the chip bumps 24 on a smaller sample of dies 12 reduces the costs and complexities associated with screening different solder materials for use with a particular combination of flip chip and external device.

Although the above methods and structures are disclosed in the context of attaching flip chips and external devices, the above methods can be used to attach other types of devices. For instance, one or more chip bumps constructed as disclosed above can provide an electrical and/or mechanical connection between contact pads on two different devices neither of which is a flip chip. For instance, the one or more chip bumps constructed as disclosed above can provide a mechanical connection between contact pads on two different optical devices.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method of forming a flip chip system, comprising:
   obtaining a chip having at least one wirebond gold bump core on a die;
   obtaining an intermediate structure consisting of a reusable substrate and a transfer pad layer formed on a surface of the reusable substrate, the transfer pad layer comprising at least one transfer pad corresponding to the at least one wirebond gold bump core, the at least one transfer pad consisting of solder paste, and the reusable substrate consisting of glass or ceramic;

transferring the transfer pad layer from the reusable substrate to the at least one wirebond gold bump core to form at least one chip bump comprising a solder layer on the at least one wirebond gold bump core;

setting the intermediate structure aside, the intermediate structure consisting of the reusable substrate after completion of the transferring step; and bonding the at least one chip bump to an electronic device to form the flip chip system.

2. The method of claim 1, wherein transferring the transfer pad layer from the reusable substrate to the at least one wirebond gold bump core includes reflowing the transfer pad layer.

3. The method of claim 1, wherein the transfer pad layer contacts the at least one wirebond bump core during the transferring.

4. The method of claim 1, wherein the at least one wirebond bump core is positioned on at least one contact pad on the die.

5. The method of claim 1, wherein the at least one wirebond bump core has a melting point above the melting point of the transfer pad layer.

6. The method of claim 1, wherein obtaining the intermediate structure includes solder printing the transfer pad layer onto the reusable substrate.

7. The method of claim 1, further comprising:
bonding the at least one chip bump to an electronic device after transferring the transfer pad layer from the reusable substrate to the at least one wirebond gold bump core.

8. The method of claim 7, wherein the solder layer contacts a contact pad on the electronic device.

9. The method of claim 7, wherein the at least one chip bump contacts a contact pad on the electronic device.

10. The method of claim 7, wherein bonding the at least one chip bump to the electronic device includes reflowing the solder layer without reflowing the at least one wirebond gold bump core.

11. The method of claim 1, wherein the solder paste includes one or more materials selected from the group consisting of tin, lead, and indium.

12. The method of claim 1, wherein the solder layer extends from the top of the at least one wirebond gold bump core to a surface of the die.

13. A method of forming a flip chip assembly comprising a die electrically connected to an electronic device, the method comprising:
forming a plurality of bump cores on the die, wherein each of the plurality of bump cores consists of a material selected from the group consisting of gold, copper, aluminum, and their alloys;

forming an intermediate structure consisting of a reusable substrate and a solder pattern printed on the reusable substrate, the solder pattern comprising a plurality of transfer pads, wherein the substrate is a glass material or a ceramic material, and wherein positions of the plurality of transfer pads of the solder pattern mirror positions of at least a portion of the plurality of bump cores;

positioning the die over the intermediate structure such that the plurality of bump cores match up with the solder pattern;

heating the die and the intermediate structure, wherein the solder pattern transfers off of the substrate and onto the plurality of bump cores to form a plurality of chip bumps on the die, with no solder residue left on the substrate;

removing the intermediate structure from the die; and bonding the plurality of bump cores to the electronic device.

14. The method of claim 13, wherein the electronic device includes a plurality of device contact pads with at least a portion of the plurality of the device contact pads mirroring the positions of the plurality of chip bumps.

15. The method of claim 13, wherein the plurality of bump cores are formed using copper pillars.

16. The method of claim 13, wherein the plurality of bump cores are formed using gold pillars.

17. The method of claim 13, wherein the plurality of bump cores are formed by stacking gold studs until the bump cores have a height of at least 0.1 mils.

18. A method applying a solder layer to a plurality of bump cores of a die;
forming a plurality of opposing solder pads on an intermediate structure, the intermediate structure consisting of the plurality of opposing solder pads and a substrate;

aligning the plurality of bump cores of the die with the plurality of opposing solder pads of the intermediate structure, reflowing the plurality of opposing solder pads off of the intermediate structure and onto the plurality of bump cores of the die to form a solder layer on the plurality of bump cores;

removing the substrate from the die, wherein after the reflowing, the intermediate structure consists of the substrate; and forming a plurality of next opposing solder pads on the intermediate structure, the intermediate structure consisting of the plurality of next opposing solder pads and the substrate.

* * * * *